(12) United States Patent
Shin et al.

(10) Patent No.: US 11,407,637 B2
(45) Date of Patent: Aug. 9, 2022

(54) DIRECT GRAPHENE GROWING METHOD

(71) Applicant: SAMSUNG ELECTRONICS CO., LTD., Suwon-si (KR)

(72) Inventors: Hyeon-jin Shin, Suwon-si (KR); Jae-young Choi, Suwon-si (KR); Yun-sung Woo, Yongin-si (KR); Seon-mi Yoon, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 19 days.

(21) Appl. No.: 16/906,214

(22) Filed: Jun. 19, 2020

(65) Prior Publication Data
US 2020/0317511 A1    Oct. 8, 2020

Related U.S. Application Data

(62) Division of application No. 13/465,488, filed on May 7, 2012, now Pat. No. 10,723,620.

(30) Foreign Application Priority Data

May 6, 2011   (KR) .......................... 10-2011-0043074
Nov. 29, 2011  (KR) .......................... 10-2011-0126279

(51) Int. Cl.
*C01B 32/186*  (2017.01)
*C23C 16/26*   (2006.01)
(Continued)

(52) U.S. Cl.
CPC .............. *B82Y 30/00* (2013.01); *B82Y 40/00* (2013.01); *C01B 32/186* (2017.08);
(Continued)

(58) Field of Classification Search
CPC ..... C23C 16/0209; C23C 16/26; C23C 16/56; C01B 32/186
See application file for complete search history.

(56) References Cited

U.S. PATENT DOCUMENTS

2007/0187694 A1   8/2007 Pfeiffer
2007/0212538 A1   9/2007 Niu
(Continued)

FOREIGN PATENT DOCUMENTS

JP   2010-153793 A    7/2010
KR   1020090017454 A  2/2009
(Continued)

OTHER PUBLICATIONS

D. Bolmatov et al., "Graphene-Based Modulation-Doped Superlattice Structures," Journal of Experimental and Theoretical Physics, vol. 112, No. 1, Jan. 2011, pp. 102-107.
(Continued)

*Primary Examiner* — Elizabeth A Burkhart
(74) *Attorney, Agent, or Firm* — Cantor Colburn LLP

(57) ABSTRACT

A method of preparing crystalline graphene includes performing a first thermal treatment including supplying heat to an inorganic substrate in a reactor, introducing a vapor carbon supply source into the reactor during the first thermal treatment to form activated carbon, and binding of the activated carbon on the inorganic substrate to grow the crystalline graphene.

4 Claims, 4 Drawing Sheets

(51) Int. Cl.

| B82Y 30/00 | (2011.01) |
| --- | --- |
| B82Y 40/00 | (2011.01) |
| H01L 21/02 | (2006.01) |
| C23C 16/02 | (2006.01) |
| C23C 16/56 | (2006.01) |

(52) U.S. Cl.
CPC .......... *C23C 16/0209* (2013.01); *C23C 16/26* (2013.01); *C23C 16/56* (2013.01); *H01L 21/0242* (2013.01); *H01L 21/0262* (2013.01); *H01L 21/02381* (2013.01); *H01L 21/02422* (2013.01); *H01L 21/02488* (2013.01); *H01L 21/02527* (2013.01); *H01L 21/02672* (2013.01)

(56) References Cited

U.S. PATENT DOCUMENTS

| 2009/0110627 | A1* | 4/2009 | Choi .................. C23C 16/56 423/447.1 |
| --- | --- | --- | --- |
| 2009/0155561 | A1 | 6/2009 | Choi et al. |
| 2009/0169919 | A1 | 7/2009 | Garcia et al. |
| 2010/0038629 | A1 | 2/2010 | Lazarev |
| 2010/0200839 | A1* | 8/2010 | Okai ................ H01L 29/78684 257/29 |
| 2010/0285639 | A1 | 11/2010 | Garcia et al. |
| 2010/0323113 | A1 | 12/2010 | Ramappa et al. |
| 2011/0033677 | A1 | 2/2011 | Shin et al. |
| 2011/0045282 | A1 | 2/2011 | Kelber |
| 2011/0064370 | A1 | 3/2011 | Abraham et al. |
| 2011/0091647 | A1 | 4/2011 | Colombo et al. |

FOREIGN PATENT DOCUMENTS

| KR | 1020090124330 A | 12/2009 |
| --- | --- | --- |
| KR | 1020100055098 A | 5/2010 |
| KR | 1020100076857 A | 7/2010 |
| KR | 1020100107403 A | 10/2010 |
| KR | 1020110014847 A | 2/2011 |
| KR | 1020110020443 A | 3/2011 |

OTHER PUBLICATIONS

D. Usachov et al., "Quasifreestanding single-layer hexagonal boron nitride as a substrate for graphene synthesis," Physical Review B, vol. 82, Issue 7, Article No. 075415, Aug. 17, 2010, p. 075415-1 to 075415-6.

H. Yanagisawa et al., "Analysis of phonons in graphene sheets by means of HREELS measurement and ab initio calculation," Surface and Interface Analysis, vol. 37, Issue 2, Feb. 2005, pp. 133-136.

Kevin T. He et al., "Separation-Dependent Electronic Transparency of Monolayer Graphene Membranes on III-V Semiconductor Substrates," NANO Letters, vol. 10, Issue 9, Sep. 2010, pp. 3446-3452.

Ling-Ling Li et al., "Fabrication of Graphene-Quantum Dots Composites for Sensitive Electrogenerated Chemiluminescence Immunosensing," Advance Functional Materials, vol. 21, Issue 5, (2011), pp. 869-878.

M. G. Rybin et al., "Formation and Identification of Graphene," Journal of Nanoelectronics and Optoelectronics, vol. 4, Issue 2, Aug. 2009, pp. 239-242.

Shubin Yang et al., Fabrication of Cobalt and Cobalt Oxide/Graphene Composites: Towards High-Performance Anode Materials for Lithium Ion Batteries., CHEMSUSCHEM, vol. 3, Issue 2, (2010), pp. 236-239.

Sneha Gaddam et al.,"Direct graphene growth on MgO: origin of the band gap," Journal of Physics: Condensed Matter, vol. 23, Issue 7., Article No. 072204, (2011), pp. 1-5 This article has been downloaded from IOPscience, (http://iopscience.iop.org).

Sung Won Hwang, et al., "Plasmon-Enhanced Ultraviolet Photoluminescence from Hybrid Structures of Graphene/ZnO Films," Physical Review Letters, vol. 105, Issue 12, Article No. 127403, Sep. 15, 2010, pp. 127403-1 to 127403-4.

V. Yu and M. Hilke, "Large contrast enhancement of graphene monolayers by angle detection," Applied Physics Letters vol. 95, Issue 15, Article No. 151904, Oct. 12, 2009, pp. 151904-1 to 151904-3.

Li, et al., Superparamagnetic Fe3O4 nanocrystals@graphene composites for energy storage devices, Journal of Materials Chemistry, vol. 21, Issue 13, Published 2011, pp. 5069-5075.

Hwang, et al., Epitaxial growth of graphitic carbon on C-face SiC and Sapphire by chemical vapor deposition (CVD), Journal List > NIHPA Author Manuscripts, J Cryst Growth. Author manuscript; available in PMC Oct. 15, 2011. Published in final edited form as: J Cryst Growth. Oct. 15, 2010; 312(21): 3219-3224. doi: 10.1016/j.jcrysgro.2010.07.046.

Suzuki, et al., Non-catalytic growth of graphene-like thin film near pattern edges fabricated on SiO2 substrates, Thin Solid Films 518 (2010) 5040-5043.

Cambaz, et al., Noncatalytic synthesis of carbon nanotubes, graphene and graphite on SiC, Carbon 46 (2008) 841-849.

\* cited by examiner

FORMATION OF CATALYST LAYER

THERMAL TREATMENT

DIRECT GRAPHENE GROWING METHOD

CROSS-REFERENCE TO RELATED APPLICATIONS

This application is a divisional of U.S. patent application Ser. No. 13/465,488, filed on May 7, 2012, which claims priority to Korean Patent Application No. 10-2011-0043074 filed on May 6, 2011 and Korean Patent Application No. 10-2011-0126279, filed on Nov. 29, 2011, and all the benefits accruing therefrom under 35 U.S.C. § 119, the contents of which in their entirety are herein incorporated by reference.

BACKGROUND

1. Field

The present disclosure relates to a method of directly growing graphene, and more particularly, to a method of directly growing graphene on a target substrate without a transfer process.

2. Description of the Related Art

Generally, graphite is an allotropic form of the element carbon having a structure in which two-dimensional ("2D") graphene sheets are stacked. There are two allotropic forms with different stacking arrangements, hexagonal and rhombohedral. The carbon atoms of the graphene sheets are connected to each other in an extended array of hexagonal rings.

Due to high transparency and high conductivity, graphene may be applicable in a variety of electronic devices, for example, in an electrode for display devices or solar cells.

Graphene may be prepared by a thermal process with supplying of a carbon source to a metal catalyst, and may then be separated and transferred to a target substrate, so that an electronic device using the graphene may be manufactured.

However, during the transfer process, damages or defects, such as tears or wrinkles, may occur in the graphene, which may negatively affect physical characteristics of a final electronic device including the graphene.

SUMMARY

Provided is a method of directly growing graphene on a target substrate. Additional aspects will be set forth in part in the description which follows and, in part, will be apparent from the description, or may be learned by practice of the presented embodiments.

According to an embodiment of the invention, a method of preparing crystalline graphene includes performing a first thermal treatment including supplying heat to an inorganic substrate in a reactor; introducing a vapor carbon supply source into the reactor during the first thermal treatment to form activated carbon; and binding the activated carbon on the inorganic substrate to grow the crystalline graphene.

In an embodiment, the first thermal treatment may be performed in a reducing atmosphere.

In an embodiment, the inorganic substrate may include at least one of a metal oxide based substrate, a silica based substrate, a boron nitride based substrate and a silicon based substrate.

In an embodiment, the inorganic substrate may have at least one of a monocrystalline structure, a polycrystalline structure and an amorphous structure.

In an embodiment, the inorganic substrate may have a thickness of from about 10 nanometers (nm) to about 100 micrometers (μm).

In an embodiment, the inorganic substrate may include a base including at least one of a silicon-based crystalline base and a sapphire crystalline base, and a thin film disposed on the base, where the thin film has a thickness in a range from about 10 nm to about 1,000 nm.

In an embodiment, the first thermal treatment may be performed at a temperature in a range from about 300° C. to about 2,000° C. for a time duration in a range from about 0.001 hour to about 1,000 hours.

In an embodiment, the method further may include a cooling process at a rate in a range about 10° C. per minute to about 100° C. per minute after the first thermal treatment.

In an embodiment, the method further may include performing a second thermal treatment after the first thermal treatment and the cooling process.

In an embodiment, the vapor carbon supply source may include at least one selected from the group consisting of carbon monoxide, methane, ethane, ethylene, ethanol, acetylene, propane, propylene, butane, butadiene, pentane, pentene, cyclopentadiene, hexane, cyclohexane, benzene and toluene.

In an embodiment, the method further may include forming a graphitization catalyst layer on the crystalline graphene grown on the inorganic substrate.

In an embodiment, the method further may include performing a second thermal treatment on the inorganic substrate with the crystalline graphene and the graphitization catalyst layer thereon such that crystallinity of the crystalline graphene is increased.

In an embodiment, the graphitization catalyst may include at least one selected from the group consisting of nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V) and zirconium (Zr).

In an embodiment, the graphitization catalyst layer may have a thickness in a range from about 100 nm to about 1,000 nm.

The crystalline graphene may have a D-band to G-band peak intensity ratio ($I_D/I_G$) of about 0.5 or less.

In an embodiment, the crystalline graphene may have a D-band to G-band peak intensity ratio ($I_D/I_G$) of from about 0.2 to about 0.001.

According to another embodiment of the invention, a graphene-on-substrate includes an inorganic substrate; and crystalline graphene disposed on at least one surface of the inorganic substrate, where the crystalline graphene is directly grown on the inorganic substrate by a growing process.

In an embodiment, the crystalline graphene may have a D-band to G-band peak intensity ratio ($I_D/I_G$) of about 0.5 or less.

According to another embodiment of the invention, an electronic device includes the above graphene-on-substrate.

BRIEF DESCRIPTION OF THE DRAWINGS

These and/or other features will become apparent and more readily appreciated from the following description of the embodiments, taken in conjunction with the accompanying drawings of which.

DETAILED DESCRIPTION

Figure 1:
FIG. 1 is a schematic diagram of an embodiment of graphene directly grown on an inorganic substrate.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

The present disclosure will now be described more fully with reference to the accompanying drawings, in which exemplary embodiments of the disclosure are shown.

According to an embodiment of the present disclosure, there is provided a method of directly growing crystalline graphene on an inorganic substrate. This method of directly growing graphene on the inorganic substrate is performed without a separate transfer process, and thus the method may simplify application processes of the graphene in an electronic device, suppressing damage of graphene that may occur during the transfer process.

In an embodiment, the method of directly growing graphene may include introducing a vapor carbon supply source into a reactor during a first thermal treatment including supplying heat to an inorganic substrate 11 (shown in FIG. 1) in the reactor to obtain activated carbon, and forming crystalline graphene 12 from binding of the activated carbon on the inorganic substrate 12. In such an embodiment, as shown in FIG. 1, the crystalline graphene 12 directly grown on the inorganic substrate 11 may be obtained.

The inorganic substrate 11 used in growing the graphene thereon may be a crystalline substrate. In an embodiment, the crystalline substrate may be monocrystalline or polycrystalline, for example. In an alternative embodiment, the crystalline substrate may be an amorphous substrate. In an embodiment, the crystalline inorganic based substrate may have any kind of crystalline plane.

In another embodiment, the inorganic substrate 11 may be, for example, any one of a metal oxide based substrate, a silica based substrate, a boron nitride based substrate and a silicon based substrate, or may include a stack of at least two thereof. In an embodiment, the metal oxide based substrate may include at least one of $Al_2O_3$, sapphire, $TiO_2$, ZnO, $ZrO_2$, $HfO_2$, MgO, NiO, $Co_2O$, CuO and FeO, for example, but not being limited thereto. In an embodiment, the boron nitride based substrate is a h-BN substrate, for example, but not being limited thereto. In an embodiment, the silica based substrate may include at least one of $SiO_2$, glass and quartz, for example, but not being limited thereto. In an embodiment, the silicon based substrate may include at least one of Si(111), Si(100) and p-Si, for example, but not being limited thereto. The inorganic substrate 11 may have a thickness of, for example, from about 10 nanometers (nm) to about 100 micrometers (μm).

An embodiment of the method of directly growing graphene may use the inorganic substrate 11. In an embodiment, when having an amorphous or polycrystalline structure, the inorganic substrate 11 having a thin film shape and stacked on a base may be used. In an embodiment, the base may be, for example, a crystalline substrate such as a silicon substrate or a sapphire substrate. The inorganic substrate 11 stacked as a thin film on the base may be provided by using atomic layer deposition, thermal oxidation, or sputtering, for example. In an embodiment, the inorganic substrate in a thin film shape may have a thickness in a range from about 10 nm to about 1,000 nm.

In an embodiment, carbon may be supplied as the vapor carbon supply source thermally treated along with the inorganic substrate. However, any of a variety of materials that may be present in a vapor phase at a temperature of 300° C. or higher may be used as the vapor carbon supply source. The vapor carbon supply source may be any carbon-containing compound. In an embodiment, the vapor carbon supply source may be a compound including six or less carbon atoms, a compound including four or less carbon atoms, or a compound including two or less carbon atoms. In an embodiment, the vapor carbon supply source may include at least one selected from the group consisting of carbon monoxide, methane, ethane, ethylene, methanol, ethanol, acetylene, propane, propylene, butane, butadiene, pentane, cyclopentadiene, hexane, cyclohexane, benzene and toluene.

The vapor carbon supply source may be injected into a reactor containing the inorganic substrate at a constant pressure. In an embodiment, the vapor carbon supply source may be injected without an additional material. In an alternative embodiment, the vapor carbon supply source may be injected with an inert gas, such as helium, argon, or nitrogen, for example.

In an embodiment, the first thermal treatment may be performed in a reducing atmosphere or a reduction atmosphere. In such an embodiment, some components of the inorganic substrate may be reduced in the reducing atmosphere, forming a graphitization catalyst that facilitates formation of graphene. In an embodiment, the inorganic substrate is a metal oxide based film, and the metal oxide on a surface of the metal oxide based film may be reduced into a metal, which may then serve as a graphitization catalyst that facilitates formation of the crystalline graphene. In an embodiment, a silicon based substrate is used as the inorganic substrate, and silica present on part of a surface of the silicon based substrate may be reduced into silicon, which may then serve as a graphitizing catalyst.

In an embodiment, as described above, metal reduced from the metal oxide present on the surface of the inorganic substrate serves as a graphitization catalyst in generating graphene. In such an embodiment, the metal present on the surface of the inorganic substrate is in an atomic level such that the metal may be identified on a crystalline plane of the inorganic substrate surface by in-situ equipment, for example, a low-energy electron diffraction ("LEED") system.

In an embodiment, a boron nitride based substrate, for example, a h-BN substrate, is used as the inorganic substrate, and graphene may be grown directly on the h-BN substrate by directly adsorbing a carbonaceous component onto the h-BN substrate without a graphitization catalyst since the h-BN substrate has a similar crystalline lattice structure as the crystalline lattice structure of graphene. In such an embodiment, where the h-BN substrate is used as the inorganic substrate, graphene may be formed under a reducing atmosphere or an inert atmosphere.

In an embodiment, the reducing atmosphere may be created using hydrogen gas, ammonia gas, nitrogen gas, and/or argon gas alone or in combination thereof, for example. In such an embodiment, hydrogen gas and/or ammonia gas are mixed with nitrogen gas and/or argon gas, and the hydrogen gas and/or ammonia gas may be used in about 0 to about 100 volume % of a total volume of the chamber. In an embodiment, for example, the hydrogen gas and/or ammonia gas may be used from about 0.01 volume % to about 50 volume %, or from about 0.01 volume % to about 10 volume % of the total volume of the chamber.

In an embodiment, the first thermal treatment described above is performed in generating crystalline graphene. In such an embodiment, the first thermal treatment may be performed at a temperature from about 300° C. to a melting point of the inorganic substrate. In an embodiment, and first thermal treatment may be performed at a temperature from about 300° C. to about 2,000° C., and in another embodiment, at a temperature from about 500° C. to about 1,500° C.

In an embodiment, the first thermal treatment may be maintained at a predetermined temperature for a predetermined time, and thus generation of the graphene may be controlled. The longer the time period of the thermal treatment, the larger the amount of generated graphene may be, and the larger the thickness of the graphene may be. In such an embodiment, the shorter the time period of the thermal treatment, the smaller the thickness of the graphene may be. In an embodiment, the time taken to perform the thermal treatment may be determined, in addition to the type and supply pressure of the vapor carbon source and the size of the chamber to obtain a predetermined thickness of the graphene. In an embodiment, the first thermal treatment may be maintained for from about 0.001 hour to about 1,000 hours. In an embodiment, the first thermal treatment may be maintained for from about 10 seconds to about 1 hour.

In an embodiment, a heat source for the first thermal treatment may be induction heat, radiant heat, a laser, infrared ("IR") heat, microwaves, plasma, ultraviolet ("UV") rays or surface plasmon heat, for example, but not being limited thereto. In an embodiment, the heat source may be attached to the chamber to increase the temperature in the chamber to a predetermined temperature.

In an embodiment, a selected cooling process is performed on the resulting product obtained after the first thermal treatment. In such an embodiment, the graphene is uniformly grown and arranged on the substrate by the selected cooling process. In an embodiment, the cooling process may be performed, for example, at about 10° C. to about 100° C. per minute. In an embodiment, the cooling process may be a natural cooling process, which may be implemented by stopping operation of a heat source or by removing the heat source from the reactor.

The crystalline graphene obtained through the cooling process may have a thickness in a range from one to about three hundred layers. In an embodiment, the graphene may have a thickness in a range from one to about sixty layers, and in some embodiments, a thickness in a range from one to about fifteen layers, and in some other embodiments, a thickness in a range from one to about 10 layers.

In an embodiment, each of the first thermal treatment and the cooling process may be performed once. In an embodiment, the first thermal treatment and the cooling process may be repeated several times to generate high-density multi-layered graphene. In such an embodiment, crystallinity of the crystalline graphene may be improved by repeating the first thermal process twice or three times.

In an embodiment, as described above, the crystalline graphene 12 is provided, e.g., formed, on the inorganic substrate 11 by the first thermal treatment.

In an embodiment, after growing the crystalline graphene directly on the inorganic substrate, a second thermal treatment may be performed. Hereinafter, the second thermal treatment will now be described in detail. In an embodiment, the second thermal treatment may be performed after the first thermal treatment and cooling process, and in another embodiment, may be performed after further formation of a graphitization catalyst layer on the crystalline graphene.

Figure 2:
FIG. 2 is a schematic diagram illustrating an embodiment of a method of directly growing graphene according to the present disclosure.
Figure 2:
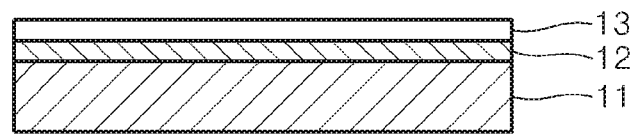
Figure 2:
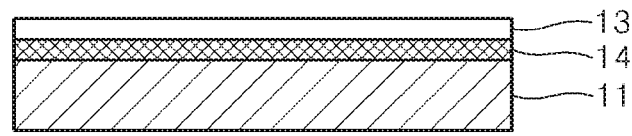

In an embodiment, the graphitization catalyst layer 13 may be formed on the crystalline graphene 12, as illustrated in FIG. 2. In such an embodiment, the graphitization catalyst layer 13 directly contacts the crystalline graphene 12, and thus helps carbon atoms link together to form a planar hexagonal structure, such that the crystallinity of the crystalline graphene 12 is substantially improved.

In an embodiment, the graphitization catalyst layer 13 may include a catalyst, which is used to synthesize graphite, induce a carbonization reaction, or prepare a carbon nanotube. In an embodiment, the catalyst may include at least one metal selected from the group consisting of nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V) and zirconium (Zr), for example. In an embodiment, the graphitization catalyst layer 13 may fixed by a method, for example, by physical deposition, chemical deposition, or sputtering.

In an embodiment, a thickness of the graphitization catalyst layer 13 may be in a range from about 100 nm to about 1,000 nm. In such an embodiment, where the thickness of the graphitization catalyst layer 13 is in the range from about 100 nm to about 1,000 nm, the crystallinity of the graphene is substantially enhanced.

In an embodiment, after the formation of the graphitization catalyst layer 13, the second thermal treatment may be further performed such that highly crystalline graphene with improved crystallinity is obtained.

In an embodiment, the second thermal treatment may be performed in an inert gas atmosphere containing, for example, helium, argon, or nitrogen. In an alternative embodiment, the second thermal treatment may be performed with hydrogen gas. In an embodiment, the second thermal treatment may be performed together with the inert gas and hydrogen gas, where a concentration of the inert gas may be in a range from about 60 volume % to about 65 volume % of a total volume of the chamber, and a concentration of hydrogen gas may be in a range from about 5 volume % to about 40 volume % of the total volume of the chamber.

In an embodiment, the second thermal treatment may be performed at a temperature in a range from about 300° C. to about 2,000° C., and in an alternative embodiment, at a temperature in a range from about 500° C. to about 1,500° C., and in another alternative embodiment, at a temperature in a range from about 800° C. to about 1,000° C.

In an embodiment, the second thermal treatment may be maintained within the above-mentioned temperature ranges for a predetermined time such that generation of the graphene may be controlled. In such an embodiment, crystallinity of the crystalline graphene is improved by maintaining the second thermal treatment during substantially long time duration, and highly crystalline graphene 14 may be prepared by controlling the predetermined time for maintaining the second thermal treatment. In an embodiment, the second thermal treatment may be maintained for from about 0.001 hour to about 100 hours. In another embodiment, the second thermal treatment may be maintained for from about 1 minute to about 12 hours.

In an embodiment, a heat source for the second thermal may be induction heat, radiant heat, a laser, IR heat, microwaves, plasma, UV rays, or surface plasmon heat, for example, but not being limited thereto. In an embodiment, such a heat source may be attached to the chamber to increase the temperature in the chamber to a predetermined temperature.

In an embodiment, a selected cooling process is performed on the resulting product obtained after the second thermal treatment. In an embodiment, the cooling process may be performed at a rate of about 10° C. to about 100° C. per minute. In an embodiment, the cooling process may be a natural cooling process, which may be implemented by stopping operation of a heat source or by removing the heat source from the reactor.

In an embodiment, each of the second thermal treatment and the cooling process may be performed once. In an alternative embodiment, the second thermal treatment and the cooling process may be repeated several times to generate graphene with improved crystallinity.

In an embodiment, after the second thermal treatment, removing the graphitization catalyst layer may be performed. Since the graphitization catalyst is in the form of a metal layer, the graphitization catalyst may be removed by acid treatment. In an embodiment, the acid treatment may be performed using hydrochloric acid, sulfuric acid, nitric acid, or a mixed solution thereof, for example, in a predetermined concentration. In an embodiment, a resulting product of the second thermal treatment may be immersed in the above-mentioned acid solutions for a predetermined time such that the graphitization catalyst layer is removed.

Crystallinity of the graphene grown directly on the inorganic substrate may be determined by Raman spectroscopy. In general, Raman spectra of graphene include a G-band near about 1,580 inverse centimeters ($cm^{-1}$) region and a D-band near about 1,340 $cm^{-1}$ region. The G-band is found in common in graphite based materials, and is also referred to as a G mode or G peak, where "G" is abbreviation for graphite. The D-band is from defects in crystals, and is typically found in edge areas of graphene samples or in graphene samples with many defects. Thus, a high peak intensity of the D-band may indicate that the graphene includes a large number of defects and has low crystallinity, and a low peak intensity of the D-band may indicate that the graphene includes a small number of defects and has high crystallinity.

In Raman spectroscopy, an intensity of the D-band is defined as a relative ratio to an intensity of the G-band. In Raman spectroscopy, crystallinity of the graphene may be determined from a relative ratio of the D-band to the G-band.

When crystalline graphene obtained by an embodiment of direct growing method, a relative intensity of the D-band to the G-band may be about 2 or less. In an embodiment, the relative intensity of the D-band to the G-band may be about 0.5 or less. In another embodiment, the relative intensity of the D-band to the G-band may be about 0.2 or less. In another embodiment, the relative intensity of the D-band to the G-band may be may be in a range from about 0.2 to about 0.001. When a D-band is not found in graphene, which means high crystallinity, a relative ratio of the D-band to the G-band of the graphene may be zero.

The term "graphene" as used herein refers to a sheet of polycyclic aromatic molecules of a plurality of covalently bonded carbon atoms, which is distinguished from cylindrical carbon nanotubes. The covalently bonded carbon atoms may form a six-membered ring as a repeating unit, and may further include at least one of a five-membered ring and/or a seven-membered ring. Thus, the graphene appears as a single layer of covalently bonded carbon atoms, and each carbon atom may be sp2 hybridized. A plurality of graphene layers is often referred to as graphite in the art. However, for convenience, "graphene," as used herein, may include one or more layers of graphene. Thus, as used herein, graphene may refer to a single layer of carbon, or also may refer to a plurality of stacked single layers of graphene, for example, about three hundred layers or less of graphene. Graphene normally has side terminals saturated with hydrogen atom.

In an embodiment, the above-described direct growing method is performed without a separate transfer process, and the crystalline graphene grown directly on the inorganic substrate by the method has a reduced number of defects when applied in an electronic device.

The crystalline graphene may have a large area with lateral and longitudinal lengths, each of which is about 1 millimeter (mm) or greater, or about 10 mm or greater, for example. In an embodiment, each of the lateral and longitudinal lengths of the crystalline graphene is in a range from about 10 mm to about 1,000 mm. In an embodiment, each of the lateral and longitudinal lengths of the crystalline graphene may be greater than 1,000 mm. The size of the inorganic substrate may be adjusted to obtain graphene with a large area. In such an embodiment, since a carbon source is supplied in vapor form, the size of the substrate may not be restricted. In such an embodiment, a three-dimensional substrate may be used.

The crystalline graphene grown on the inorganic substrate may have a variety of applications. Due to high conductivity and high uniformity of the graphene layer, the graphene may be used as a transparent electrode. In an embodiment of a solar cell with an electrode on a substrate, the solar cell may include the graphene as the electrode thereof such that the electrode allows transmission of light. The highly crystalline graphene-on-the inorganic substrate may exhibit high conductivity when used as a transparent electrode. In an embodiment of a display device, the highly crystalline graphene-on-substrate, used as a panel conducting thin layer thereof, may provide substantially high conductivity and may improve the transmission of light.

In an embodiment, the highly crystalline graphene-on-substrate may be used as a channel for memory devices, sensors or electronic paper, for example.

One or more embodiments will now be described in more detail with reference to the following examples. However, these examples are for illustrative purposes only and are not intended to limit the scope of the one or more embodiments.

Example 1

A $SiO_2$ thin film having a thickness of about 300 nm was formed on a silicon substrate (Si(100)) having a diameter of about 2 inches and a thickness of about 525 μm using thermal oxidation. The silicon substrate with the $SiO_2$ thin film thereon was placed in a chamber, and was then thermally treated at about 1,100° C. for about 10 minutes using an inductive heating source (a first thermal treatment) while hydrogen gas and nitrogen gas were supplied into the chamber at about 5 standard cubic centimeters per minute (sccm) and about 4,970 sccm, respectively. Subsequently, acetylene gas was further injected into the chamber at about 25 sccm for about 10 minutes, thereby growing graphene. The inductive heating source was removed from the chamber, which was then naturally cooled such that crystalline graphene was formed on the $SiO_2$ thin film.

Example 2

An $Al_2O_3$ thin film having a thickness of about 50 nm was formed on a silicon substrate (Si(100)) having a diameter of about 2 inches and a thickness of about 525 μm using atomic layer deposition. The silicon substrate with the $Al_2O_3$ thin film formed was placed in a chamber, and was then thermally treated at about 1,100° C. for about 10 minutes using an inductive heating source (the first thermal treatment) while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled such that crystalline graphene was formed on the $Al_2O_3$ thin film.

Example 3

A planar h-BN substrate having a thickness of about 0.5 μm and a size of about 1 centimeter (cm) by about 1 centimeter (cm) was placed in a chamber, and was then thermally treated at about 1,100° C. for about 10 minutes using an inductive heating source (the first thermal treatment) while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled so that crystalline graphene was formed on the h-BN substrate.

Example 4

A $HfO_2$ thin film having a thickness of about 50 nm was formed on a silicon substrate (Si(100)) having a diameter of about 2 inches and a thickness of about 525 μm using atomic layer deposition. The silicon substrate with the $HfO_2$ thin film formed was placed in a chamber, and was then thermally treated at about 1,100° C. for about 10 minutes (the first thermal treatment) using an inductive heating source while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled so that crystalline graphene was formed on the HfO$_2$ thin film.

Example 5

A ZnO thin film having a thickness of about 50 nm was formed on a silicon substrate (Si(100)) having a diameter of about 2 inches and a thickness of about 525 μm using atomic layer deposition. The silicon substrate with the ZnO thin film formed was placed in a chamber, and was then thermally treated at about 1,100° C. for about 10 minutes using an inductive heating source (the first thermal treatment) while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled such that crystalline graphene was formed on the ZnO thin film.

Example 6

A planar quartz substrate having a thickness of about 0.5 μm and a size of about 2.5 cm by about 2.5 cm was placed in a chamber, and was then thermally treated at about 1,100° C. for about 10 minutes using an inductive heating source (the first thermal treatment) while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled such that crystalline graphene was formed on the quartz substrate.

Example 7

A silicon substrate (Si(111)) having a thickness of about 575 μm and a size of 1 cm by 1 cm was placed in a chamber, and was then thermally treated at about 1,100° C. for about 10 minutes using an inductive heating source (the first thermal treatment) while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled so that crystalline graphene was formed on the silicon substrate.

Example 8

A sapphire (0001) substrate having a thickness of about 300 μm and a diameter of about 2 inches was placed in a chamber, and was then thermally treated at about 1,100° C. for about 10 minutes using an inductive heating source (the first thermal treatment) while hydrogen gas and nitrogen gas were supplied into the chamber at about 10 sccm and about 4,940 sccm, respectively. Subsequently, acetylene gas was further injected into the chamber at about 50 sccm for about 10 minutes, thereby growing graphene. The inductive heating source was removed from the chamber, which was then naturally cooled such that crystalline graphene was formed on the sapphire (0001) substrate.

Subsequently, copper was deposited on the crystalline graphene using e-beam evaporation to form a copper catalyst layer having a thickness of about 500 nm.

The substrate with the copper catalyst layer formed was further thermally treated at about 1,000° C. for about 60 minutes to obtain highly crystalline graphene (the second thermal treatment).

Subsequently, the substrate with the highly crystalline graphene was immersed in an about 0.1 mol (M) HCl solution for about 24 hours, thereby removing the nickel catalyst layer.

Figure 3:
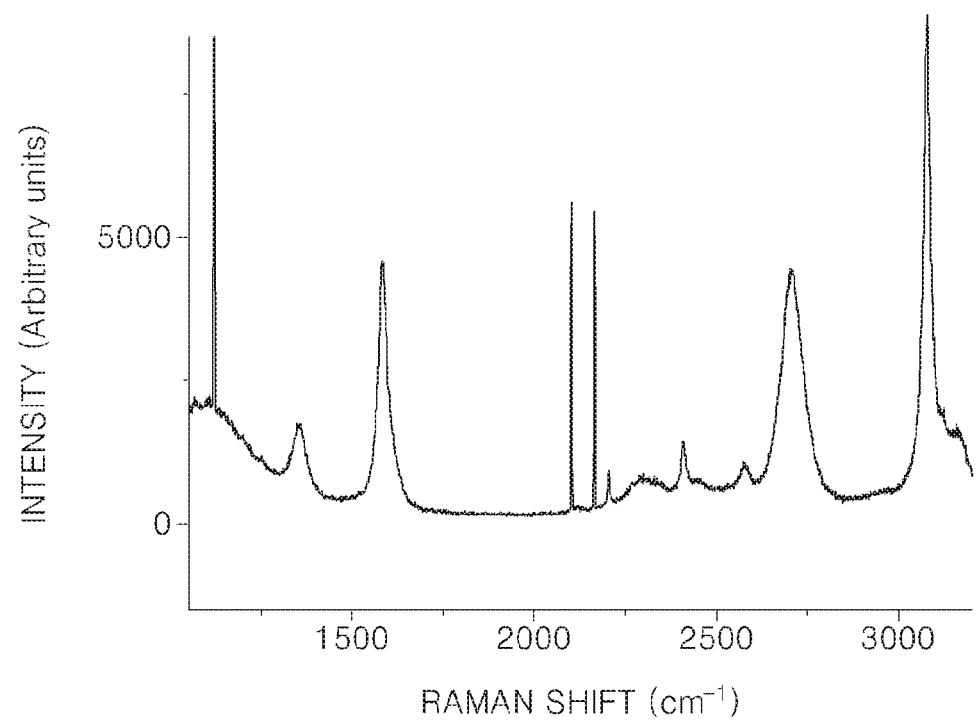
FIGS. 3 to 5 are graphs illustrating intensity (arbitrary unit) versus Raman shift inverse centimeters ($cm^{-1}$), showing Raman spectra of an embodiment of a graphene sheet prepared in accordance with Example 1.

A result of analyzing the highly crystalline graphene is shown in FIG. 3. Referring to FIG. 3, the highly crystalline graphene may have a D-band to G-band peak intensity ratio ($I_D/I_G$) of about 0.1 or less, indicating high crystallinity. Herein, the D-band to G-band peak intensity ratio ($I_D/I_G$) means a ratio of D-band peak intensity with respect to the D-band peak intensity.

Example 9

A sapphire (0001) substrate having a thickness of about 300 μm and a diameter of about 2 inches was placed in a chamber, and was then thermally treated at about 1,100° C. for about 10 minutes using an inductive heating source (the first thermal treatment) while hydrogen gas and nitrogen gas were supplied into the chamber at about 10 sccm and about 4,930 sccm, respectively. Subsequently, acetylene gas was further injected into the chamber at about 200 sccm for about 10 minutes, thereby growing graphene. The inductive heating source was removed from the chamber, which was then naturally cooled such that crystalline graphene was formed on the sapphire substrate.

Subsequently, nickel was deposited on the crystalline graphene using e-beam evaporation to form a nickel catalyst layer having a thickness of about 300 nm. The substrate with the nickel catalyst layer formed was further thermally treated at about 1,000° C. for about 60 minutes to obtain highly crystalline graphene (a second thermal treatment).

Subsequently, the substrate with the highly crystalline graphene was immersed in an about 0.1 M HCl solution for about 24 hours, thereby removing the nickel catalyst layer.

Figure 4:
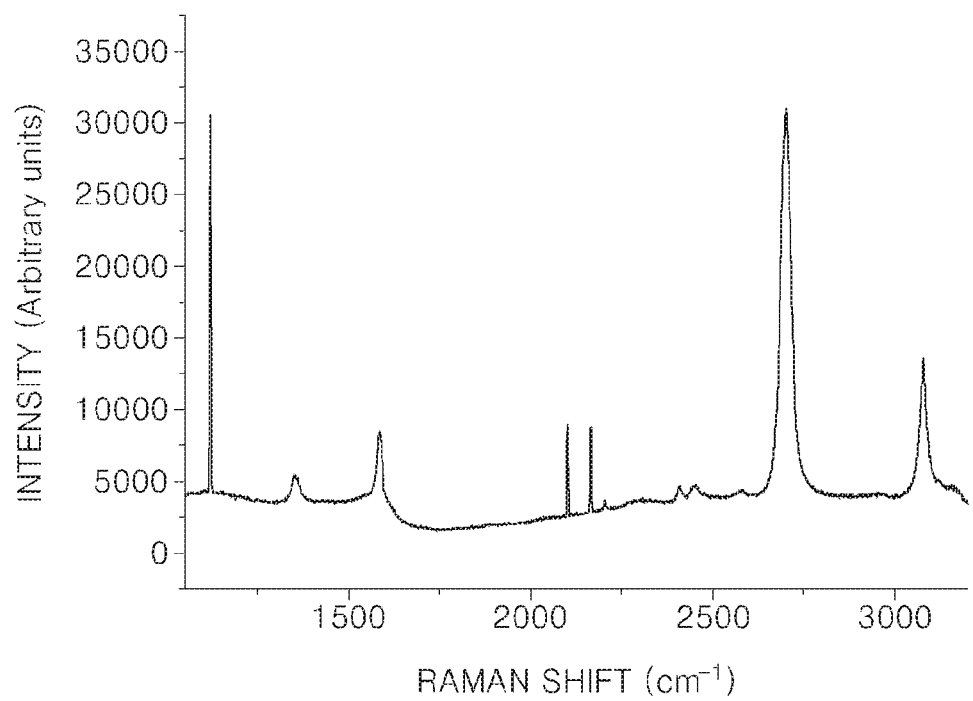

A result of analyzing the highly crystalline graphene is shown in FIG. 4. Referring to FIG. 4, the highly crystalline graphene was found to have a D-band to G-band peak intensity ratio ($I_D/I_G$) of about 0.1 or less, indicating high crystallinity.

Example 10

A SiO$_2$ thin film having a thickness of about 300 nm was formed on a silicon substrate (Si(100)) having a diameter of about 2 inches and a thickness of about 525 μm using thermal oxidation. The silicon substrate with the SiO$_2$ thin film formed was placed in a chamber, and was then thermally treated at about 1,100° C. for about 10 minutes using an inductive heating source while hydrogen gas and nitrogen gas were supplied into the chamber at about 5 sccm and about 4,970 sccm, respectively. Subsequently, acetylene gas was further injected into the chamber at about 25 sccm for about 10 minutes, thereby growing graphene. The inductive heating source was removed from the chamber, which was then naturally cooled so that crystalline graphene was formed on the SiO$_2$ thin film.

Subsequently, nickel was deposited on the crystalline graphene using e-beam evaporation to form a nickel catalyst layer having a thickness of about 300 nm. The substrate with the nickel catalyst layer formed was further thermally treated at about 900° C. for about 10 minutes to obtain highly crystalline graphene (the second thermal treatment).

Subsequently, the substrate with the highly crystalline graphene was immersed in an about 0.1 M HCl solution for about 24 hours, thereby removing the nickel catalyst layer.

Figure 5:
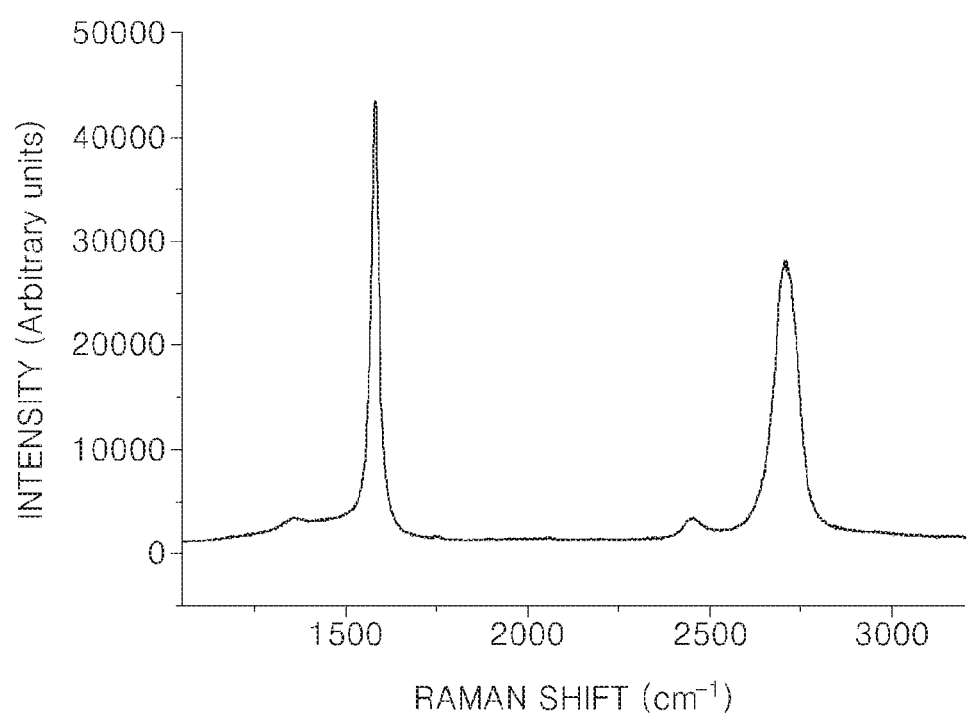

A result of analyzing the highly crystalline graphene is shown in FIG. 5. Referring to FIG. 5, the highly crystalline graphene was found to have a D-band to G-band peak intensity ratio ($I_D/I_G$) of about 0.1 or less, indicating high crystallinity.

Example 11

A sapphire (0001) substrate having a thickness of about 300 μm and a diameter of about 2 inches was placed in a chamber, and was then thermally treated at about 1,100° C. for about 10 minutes using an inductive heating source (the first thermal treatment) while hydrogen gas and nitrogen gas were supplied into the chamber at about 10 sccm and about 4,930 sccm, respectively. Subsequently, acetylene gas was further injected into the chamber at about 200 sccm for about 10 minutes, thereby growing graphene. The inductive heating source was removed from the chamber, which was then naturally cooled such that crystalline graphene was formed on the sapphire substrate.

Subsequently, a nickel-copper alloy was deposited on the crystalline graphene using e-beam evaporation to form a nickel-copper alloy catalyst layer having a thickness of about 300 nm. The substrate with the nickel-copper alloy catalyst layer formed was further thermally treated at about 1,000° C. for about 60 minutes to obtain highly crystalline graphene (the second thermal treatment).

Subsequently, the substrate with the highly crystalline graphene was immersed in an about 0.1 M HCl solution for about 24 hours, thereby removing the nickel catalyst layer.

As described above, according to the one or more of the above embodiments of the present disclosure, crystalline graphene may be grown directly on an inorganic substrate without a separate transfer process. The crystalline graphene on the inorganic substrate with reduced number of defects in the graphene may be used in a variety of devices.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. Crystalline graphene obtained by a method comprising:
    performing a first thermal treatment including supplying heat to an inorganic substrate in a reactor;
    introducing a vapor carbon supply source into the reactor during the first thermal treatment to form activated carbon; and
    binding the activated carbon on the inorganic substrate to grow the crystalline graphene; wherein the inorganic substrate includes a metal oxide based substrate; wherein the metal oxide includes at least one of $TiO_2$, ZnO, MgO, NiO, $Co_2O$, CuO and FeO;
    wherein the crystalline graphene has a D-band to G-band peak intensity ratio ($I_D/I_G$) of about 0.5 or less.

2. A graphene-on-substrate comprising:
    an inorganic substrate; and
    crystalline graphene disposed on at least one surface of the inorganic substrate,
    wherein the crystalline graphene is directly grown on the inorganic substrate by a growing process; and wherein the inorganic substrate includes any one of the metal oxide based substrate, a silica based substrate, and a silicon based substrate, or a stack of at least two thereof; wherein the metal oxide includes at least one of $TiO_2$, ZnO, MgO, NiO, $Co_2O$, CuO and FeO.

3. The graphene-on-substrate of claim 2, wherein the crystalline graphene has a D-band to G-band peak intensity ratio ($I_D/I_G$) of about 0.5 or less.

4. An electronic device comprising the graphene-on-substrate of claim 2.

* * * * *